(12) United States Patent
Vashchenko et al.

(10) Patent No.: US 6,541,801 B1
(45) Date of Patent: Apr. 1, 2003

(54) TRIAC WITH A HOLDING VOLTAGE THAT IS GREATER THAN THE DC BIAS VOLTAGES THAT ARE ON THE TO-BE-PROTECTED NODES

(75) Inventors: Vladislav Vashchenko, Fremont, CA (US); Peter J. Hopper, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 54 days.

(21) Appl. No.: 09/782,389

(22) Filed: Feb. 12, 2001

(51) Int. Cl.[7] .................. H01L 29/74; H01L 31/111; H01L 23/62
(52) U.S. Cl. .................. 257/119; 257/122; 257/124; 257/133; 257/140; 257/141; 257/146; 257/162; 257/355; 257/360; 257/361; 257/362
(58) Field of Search ................. 257/119, 122, 257/124, 133, 140, 141, 146, 162, 355, 356, 360, 361, 362

(56) References Cited

U.S. PATENT DOCUMENTS 6,355,959 B1 * 3/2002 Vashchenko et al. ....... 257/355

OTHER PUBLICATIONS

U.S. patent application Ser. No. 09/768,033, Vashchenko et al., filed Jan. 22, 2001.

* cited by examiner

*Primary Examiner*—Steven Loke
(74) *Attorney, Agent, or Firm*—Mark C. Pickering

(57) ABSTRACT

The holding voltage (the minimum voltage required for operation) of a triac is increased to a value that is greater than a dc bias on to-be-protected nodes. The holding voltage is increased by inserting a voltage drop between each p+ region and a to-be-protected node. As a result, the triac can be utilized to provide ESD protection to power supply pins.

18 Claims, 3 Drawing Sheets

TRIAC WITH A HOLDING VOLTAGE THAT IS GREATER THAN THE DC BIAS VOLTAGES THAT ARE ON THE TO-BE-PROTECTED NODES

BACKGROUND OF THE INVENTION

1. Field of the Invention

The present invention relates to a triode ac switch (triac) and, more particularly, to a triac with a holding voltage that is greater than the dc bias voltages that are on the to-be-protected nodes.

2. Description of the Related Art

A triode ac switch (triac) is a device that provides an open circuit between a first node and a second node when the first-to-second node voltage is positive and less than a trigger voltage. When the first-to-second node voltage rises to be equal to or greater than the trigger voltage, the triac provides a low-resistance current path between the first and second nodes. Further, once the low-resistance current path has been provided, the triac maintains the current path as long as the first-to-second node voltage is positive and equal to or greater than a holding voltage that is lower than the trigger voltage.

The triac, which is a symmetrical device, also provides an open circuit between the second node and the first node when the second-to-first node voltage is positive and less than the trigger voltage. When the second-to-first node voltage rises to be equal to or greater than the trigger voltage, the triac provides a low-resistance current path between the second and first nodes. Further, once the low-resistance current path has been provided, the triac maintains the current path as long as the second-to-first node voltage is positive and equal to or greater than the holding voltage. Thus, the triac provides an identical structure to both the first and second nodes.

As a result of these characteristics, triacs have been used to provide electrostatic discharge (ESD) protection for semiconductor circuits. When used for ESD protection, the first node becomes a first to-be-protected node, and the second node becomes a second to-be-protected node.

The triac operates within an ESD protection window that has a maximum voltage defined by the destructive breakdown level of the to-be-protected nodes, and a minimum voltage (also known as a latch-up voltage) defined by any dc bias that is on the to-be-protected nodes. The trigger voltage of the triac is set to a value that is less than the maximum voltage of the window, while the holding voltage is set to a value that is greater than the minimum voltage of the window.

Thus, when the voltage across the first to-be-protected node and the second to-be-protected node is positive and less than the trigger voltage, the triac provides an open circuit between the first to-be-protected node and the second to-be-protected node. Similarly, when the voltage across the second to-be-protected node and the first to-be-protected node is positive and less than the trigger voltage, the triac also provides an open circuit between the second to-be-protected node and the first to-be-protected node.

However, when the first to-be-protected node receives a voltage spike that equals or exceeds the trigger voltage, such as when an ungrounded human-body contact occurs, the triac provides a low-resistance current path from the first to-be-protected node to the second to-be-protected node. Similarly, when the second to-be-protected node receives a voltage spike that equals or exceeds the trigger voltage, the triac provides a low-resistance current path from the second to-be-protected node to the first to-be-protected node.

In addition, once the ESD event has passed and the voltage on the first to-be-protected node falls below the holding voltage, the triac again provides an open circuit between the first to-be-protected node and the output node. Similarly, after the ESD event has passed and the voltage on the second to-be-protected node falls below the holding voltage, the triac again provides an open circuit between the second to-be-protected node and the first to-be-protected node.

FIG. 1 shows a cross-sectional diagram that illustrates a conventional triac 100. As shown in FIG. 1, triac 100 has spaced apart n-wells 112 and 114 which are formed in a p-type material 110, such as a well or a substrate. In addition, triac 100 has a n+ region 116 and a p+ region 118 which are formed in n-well 112, and a n+ region 120 which is formed in p-type material 110 and n-well 112. N+ and p+ regions 116 and 118, in turn, are both connected to a first to-be-protected node 122.

As further shown in FIG. 1, triac 100 also has a n+ region 124 and a p+ region 126 which are formed in n-well 114, and a n+ region 128 which is formed in p-type material 110 and n-well 114. N+ and p+ regions 124 and 126, in turn, are both connected to a second to-be-protected node 130.

Triac 100 further has a channel region 132 that is defined between n+ region 120 and n+ region 128. In addition, triac 100 has a gate oxide layer 134 that is formed on material 110 over channel region 132, and a gate 136 that is formed on gate oxide layer 134. N+ (drain and source) regions 120 and 128, gate oxide layer 134, and gate 136 define a NMOS transistor 140 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

When a voltage across nodes 122 and 130 is positive and less than a trigger voltage, the voltage reverse biases the junction between n+ (drain) region 120/n-well 112 and p-type material 110, and forward-biases the junction between n+ (source) region 128/n-well 114 and p-type material 110. The reverse-biased junction, in turn, blocks current from flowing from node 122 to node 130.

On the other hand, when the voltage across nodes 122 and 130 is equal to or greater than the trigger voltage, the reverse-biased junction breaks down due to avalanche multiplication. Since NMOS transistor 140 is formed to be identical to the to-be-protected MOS transistors, the junction between n+ region 120 and p-type material 110 breaks down at the same time that the to-be-protected MOS transistors experience junction break down.

Since junction break down occurs before the MOS transistors experience destructive gate oxide break down, triac 100 turns on before destructive gate oxide breakdown occurs, thereby protecting the MOS transistors. Thus, the junction break down voltage, which is less than the voltage level that causes destructive gate oxide break down, functions as the trigger voltage.

The breakdown of the junction due to avalanche multiplication causes a large number of holes to be injected into p-type material 110, and a large number of electrons to be injected into n-well 112. The holes injected into material 110 turn on a npn transistor that utilizes n+ region 128 as an emitter, p-type material 110 as a base, and n-well 112 as a collector.

When the npn transistor turns on, n+ (emitter) region 128 injects electrons into (base) material 110. Most of the injected electrons diffuse through (base) material 110 and are swept from (base) material 110 into (collector) n-well 112 by the electric field that extends across the reverse-biased junction. The electrons in (collector) n-well 112 are then collected by n+ region 116.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor.

The electrons that are injected and swept into n-well 112 also decrease the potential of n-well 112 in the region that lies adjacent to p+ region 118, and eventually forward bias the junction between p+ region 118 and n-well 112. When the decreased potential forward biases the junction between p+ region 118 and n-well 112, a pnp transistor that utilizes p+ region 118 as an emitter, n-well 112 as a base, and material 110 as a collector turns on.

When turned on, p+ (emitter) region 118 injects holes into (base) n-well 112. Most of the injected holes diffuse through (base) n-well 112 and are swept from (base) n-well 112 into (collector) material 110 by the electric field that extends across the reverse-biased junction. The holes in (collector) material 110 flow into the forward-biased junction between p-type material 110 and n+ region 128/n-well 114, and are then collected by p+ region 126.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 128. As a result, a small part of the pnp collector current forms the base current of the npn transistor.

Thus, n+ region 128 injects electrons that provide both the electrons for the collector current of the npn transistor as well as the electrons for the base current of the pnp transistor. At the same time, p+ region 118 injects holes that provide both the holes for the collector current of the pnp transistor as well as the holes for the base current of the npn transistor.

When a voltage spike occurs on the second to-be-protected node rather than the first to-be-protected node, triac 100 operates the same, only in reverse. Thus, when a voltage across nodes 128 and 122 is positive and less than a trigger voltage, the voltage reverse biases the junction between n+ region 128/n-well 114 and p-type material 110, and forward-biases the junction between n+ region 120/n-well 112 and p-type material 110. The reverse-biased junction, in turn, blocks current from flowing from node 128 to node 122.

On the other hand, when the voltage across nodes 128 and 122 is equal to or greater than the trigger voltage, the reverse-biased junction breaks down due to avalanche multiplication. The breakdown causes a large number of holes to be injected into p-type material 110, and a large number of electrons to be injected into n-well 114.

The injected holes turn on a npn transistor that utilizes n+ region 120 as an emitter, p-type material 110 as a base, and n-well 114 as a collector. When the npn transistor turns on, n+ (emitter) region 120 injects electrons into (base) material 110. Most of the injected electrons diffuse through (base) material 110 and are swept from (base) material 110 into (collector) n-well 114 by the electric field that extends across the reverse-biased junction. The electrons in (collector) n-well 114 are then collected by n+ region 124.

A small number of the electrons injected into (base) material 110 recombine with holes in (base) material 110 and are lost. The holes lost to recombination with the injected electrons are replaced by holes injected into (base) material 110 by the broken-down reverse-biased junction and the collector current of a pnp transistor.

The electrons that are injected and swept into n-well 114 also decrease the potential of n-well 114 in the region that lies adjacent to p+ region 126, and eventually forward bias the junction between p+ region 126 and n-well 114. When the decreased potential forward biases the junction between p+ region 126 and n-well 114, a pnp transistor that utilizes p+ region 126 as an emitter, n-well 114 as a base, and p-type material 110 as a collector turns on.

When turned on, p+ (emitter) region 126 injects holes into (base) n-well 114. Most of the injected holes diffuse through (base) n-well 114 and are swept from (base) n-well 114 into (collector) material 110 by the electric field that extends across the reverse-biased junction. The holes in (collector) material 110 flow into the forward-biased junction between material 110 and n-well 112, and are then collected by p+ region 118.

A small number of the holes injected into (base) n-well 114 recombine with electrons in (base) n-well 114 and are lost. The electrons lost to recombination with the injected holes are replaced by electrons flowing into n-well 114 as a result of the broken-down reverse-biased junction, and n-well 114 being the collector of the npn transistor. Thus, a small part of the npn collector current forms the base current of the pnp transistor.

Similarly, the holes swept into (collector) material 110 also provide the base current holes necessary to compensate for the holes lost to recombination with the diffusing electrons injected by n+ (emitter) region 120. As a result, a small part of the pnp collector current forms the base current of the npn transistor.

Thus, n+ region 120 injects electrons that provide both the electrons for the collector current of the npn transistor as well as the electrons for the base current of the pnp transistor. At the same time, p+ region 126 injects holes that provide both the holes for the collector current of the pnp transistor as well as the holes for the base current of the npn transistor.

Some of the advantages of triac 100 over other ESD protection devices, such as a grounded-gate MOS transistor, are the double protection and double injection provided by triac 100. For double protection, triac 100 provides ESD protection regardless of whether the ESD event takes place on first node 122 or second node 130. For double injection, n+ region 128 injects electrons and p+ region 118 injects holes when the ESD event takes place on first node 122, and n+ region 120 injects electrons and p+ region 126 injects holes when the ESD event takes place on second node 130.

With double injection, triac 100 provides current densities (after snapback) that are about ten times greater than the densities provided by a grounded-gate MOS device, thus increasing the ESD protection capability. (Protection capability can be defined as the required contact width of the structure required to protect from a given ESD pulse amplitude, or the maximum protected ESD pulse amplitude for a given contact width.)

One of the disadvantages of triac 100, however, is that triac 100 suffers from a holding voltage that is often less than the minimum (or latch-up) voltage of the ESD protection window. As a result, triacs are unattractive candidates for providing ESD protection to power supply pins.

When the minimum (or latch-up) voltage of the ESD protection window is equal to a dc bias, such as the power supply voltage, and the holding voltage is less than the minimum voltage, triac 100 can not turn off (thus latching up) after the ESD event has passed. Thus, power must be cycled after the ESD event.

For example, assume that node 122 is a power supply pin at 3.3 volts, node 130 is a ground pin, the junction breakdown voltages of the to-be-protected MOS transistors are 7.0 volts, and the holding voltage is 1.8 volts. In this example, triac 100 is turned off under normal operating conditions when the voltage on node 122 is 3.3 volts. When the voltage on node 122 spikes up to a value equal to or greater than the trigger voltage (7 volts in this example), triac 100 turns on, thereby protecting the MOS devices that receive power from node 122.

However, once the ESD event has passed, it takes only 1.8 volts on node 122 to keep triac 100 in this example turned on. Since the normal operating voltage on node 122 is 3.3 volts, triac 100 remains turned on (is latched up) after the ESD event has passed. Thus, to provide ESD protection to lines with a dc bias, such as power supply lines, via a triac, there is a need for a triac with a holding voltage that is greater than the dc bias.

SUMMARY OF THE INVENTION

The present invention provides a low-voltage triggering silicon-controlled rectifier (LVTSCR) that increases the value of the holding voltage by inserting a voltage drop circuit between a to-be-protected node with a dc bias, such as a power supply node, and the emitter of the pnp transistor of the LVTSCR.

A low-voltage triggering silicon-controlled rectifier (LVTSCR) in accordance with the present invention is formed in a semiconductor material of a first conductivity type, and includes a well of a second conductivity type that is formed in the semiconductor material. The LVTSCR also includes a first region of the second conductivity type that is formed in the well, and a second region of the first conductivity type that is formed in the well. The first region is connected to a first node.

The LVTSCR further includes a third region of the second conductivity type that is formed in the semiconductor material, and a fourth region of the first conductivity type that is formed in the semiconductor material. The third and fourth regions are connected to a second node. The LVTSCR additionally includes a fifth region of the second conductivity type that is formed in the semiconductor material, and a voltage drop circuit that is connected between the second region and the first node.

The present invention also includes a method for operating the LVTSCR that includes the steps of placing a first voltage on the first region, and placing a second voltage on the second region where the first and second voltages are different. In addition, the method includes the step of placing a third voltage on the third and fourth regions.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
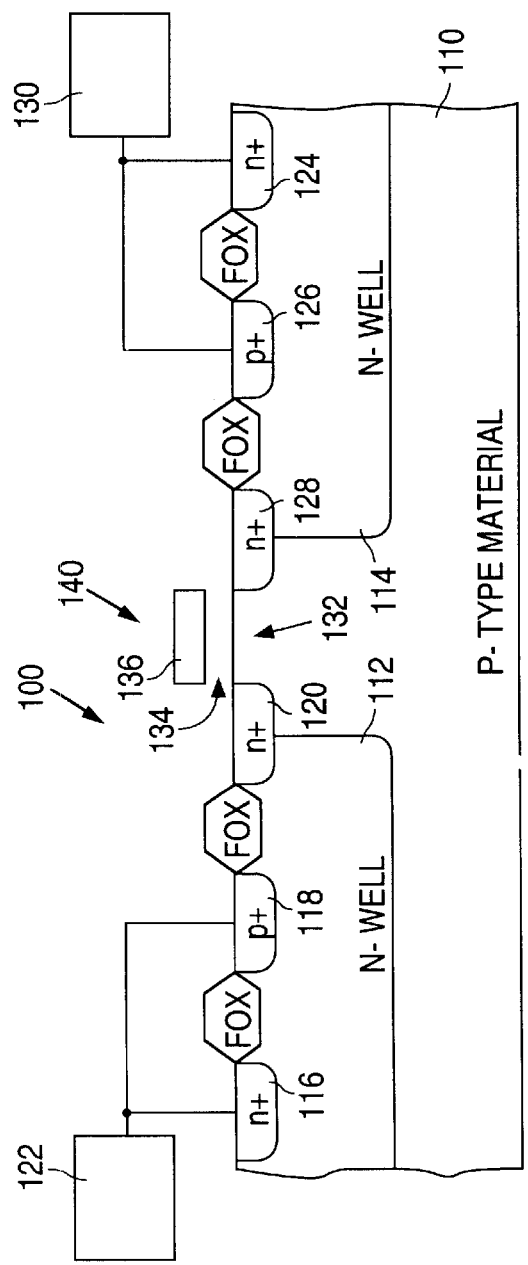
FIG. 1 is a cross-sectional view illustrating a conventional triac 100.
Figure 2:
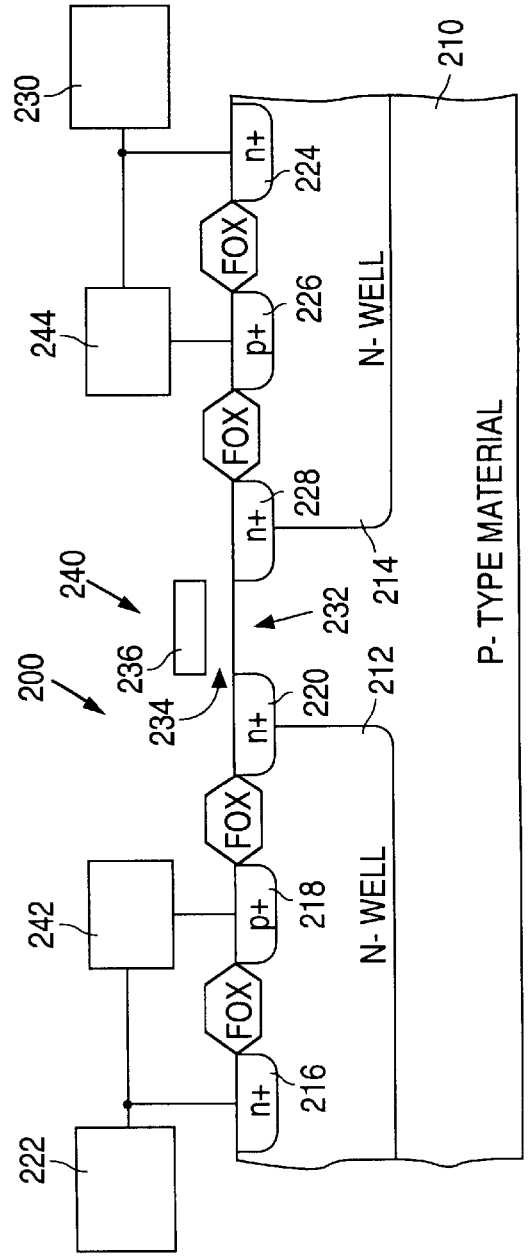
FIG. 2 is a cross-sectional diagram illustrating a triac 200 in accordance with the present invention.

FIG. 2 shows a cross-sectional view that illustrates a triode ac switch (triac) 200 in accordance with the present invention. As described in greater detail below, triac 200 increases the value of the holding voltage by connecting each p+ region to a to-be-protected node via a voltage drop.

As shown in FIG. 2, triac 200 has spaced apart n-wells 212 and 214 that are formed in a p-type semiconductor material 210, such as a substrate or a well. In addition, triac 200 has a n+ region 216 and a p+ region 218 which are formed in n-well 212, and a n+ region 220 which is formed in p-type material 210 and n-well 212. N+ region 216, in turn, is connected to a first to-be-protected node 222.

As further shown in FIG. 2, triac 200 also has a n+ region 224 and a p+ region 226 formed in n-well 214, and a n+ region 228 which is formed in p-type material 210 and n-well 214. N+ region 224, in turn, is connected to a second to-be-protected node 230.

Triac 200 further has a channel region 232 that is defined between n+ region 220 and n+ region 228. In addition, triac 200 includes a gate oxide layer 234 that is formed on material 210 over channel region 232, and a gate 236 that is formed on gate oxide layer 234. N+ (drain and source) regions 220 and 228, gate oxide layer 234, and gate 236 define a NMOS transistor 240 which is typically formed to be identical to the to-be-protected MOS transistors in the circuit. Gate oxide layer 234 and gate 236 are optional elements of triac 200, but are preferably used because of manufacturing and other considerations. (Gate 236, for example, self aligns the implants that form the n+ regions 220 and 228.)

In accordance with the present invention, triac 200 also includes a first voltage drop circuit 242 that is connected between p+ region 218 and first node 222, and a second voltage drop circuit 244 that is connected between p+ region 226 and second node 230.

As noted above, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

In operation, when a voltage across nodes 222 and 230 is positive and less than a trigger voltage, the voltage reverse biases the junction between n+ region 220/n-well 212 and p-type material 210, and forward-biases the junction between n+ region 228/n-well 214 and p-type material 210. The reverse-biased junction, in turn, blocks current from flowing from node 222 to node 230.

On the other hand, when the voltage across nodes 222 and 230 is equal to or greater than the trigger voltage, the reverse-biased junction breaks down due to avalanche multiplication. Since NMOS transistor 240 is formed to be identical to the to-be-protected MOS transistors, the junction between n+ region 220 and p-type material 210 breaks down at the same time that the to-be-protected MOS transistors experience junction break down.

Since junction break down occurs before the MOS transistors experience destructive gate oxide break down, triac 200 turns on before destructive gate oxide breakdown occurs, thereby protecting the MOS transistors. Thus, the junction break down voltage, which is less than the voltage level that causes destructive gate oxide break down, functions as the trigger voltage. In addition, other techniques, such as reducing the width of channel region 232, can be used to lower the trigger voltage so that the region 220 to material 210 junction breaks down before the to-be-protected MOS transistors experience junction break down.

The breakdown of the junction due to avalanche multiplication causes a large number of holes to be injected into p-type material 210, and a large number of electrons to be injected into n-well 212. The increased number of holes provides a base current that turns on a npn transistor that utilizes n+ region 228 as an emitter, p-type material 210 as a base, and n-well 212 as a collector.

When the npn transistor turns on, n+ (emitter) region 228 injects electrons into material 210. Most of the injected electrons diffuse through (base) material 210 and are swept from (base) material 210 into (collector) n-well 212 by the electric field that extends across the reverse-biased junction. The electrons in (collector) n-well 212 are then collected by n+ region 216.

A small number of the electrons injected into (base) material 210 recombine with holes in (base) material 210 and are lost. The holes lost to recombination with the injected electrons are replaced by holes injected into (base) material 210 by the broken-down reverse-biased junction and, as described below, by the collector current of a pnp transistor.

The electrons that are injected and swept into n-well 212 also decrease the potential of n-well 212 in the region that lies adjacent to p+ region 218, and eventually forward bias the junction between p+ region 218 and n-well 212. When the decreased potential forward biases the junction between p+ region 218 and n-well 212, a pnp transistor that utilizes p+ region 218 as an emitter, n-well 212 as a base, and p-type material 210 as a collector turns on.

When turned on, p+ (emitter) region 218 injects holes into (base) n-well 212. Most of the injected holes diffuse through (base) n-well 212 and are swept from (base) n-well 212 into (collector) material 210 by the electric field that extends across the reverse-biased junction. The holes in (collector) material 210 flow into the forward-biased junction between p-type material 210 and n+ region 228/n-well 214, and are then collected by p+ region 226.

A small number of the holes injected into (base) n-well 212 recombine with electrons in (base) n-well 212 and are lost. The electrons lost to recombination with the injected holes are replaced by electrons flowing into n-well 212 as a result of the broken-down reverse-biased junction, and n-well 212 being the collector of the npn transistor. Thus, a small part of the npn collector current forms the base current of the pnp transistor.

Similarly, as noted above, the holes swept into (collector) material 210 also provide the base current holes necessary to compensate for the holes lost to recombination with the diffusing electrons injected by n+ (emitter) region 228. As a result, a small part of the pnp collector current forms the base current of the npn transistor.

N+ region 228 injects electrons that provide both the electrons for the collector current of the npn transistor as well as the electrons for the base current of the pnp transistor. At the same time, p+ region 218 injects holes that provide both the holes for the collector current of the pnp transistor as well as the holes for the base current of the npn transistor.

In accordance with the present invention, the voltage dropped across voltage drop circuit 242 causes the voltage on p+ (pnp emitter) region 218 to be less than the voltage on n+ region 216. Thus, as an ESD event passes and the voltage on node 222 falls, the lower falling voltage on p+ region 218 reduces the forward bias across the junction between p+ region 218 and n-well 212, and eventually substantially reduces the number of holes injected into n-well 212.

Reducing the number of holes injected into n-well 212 reduces the number of holes that are swept into material 210. Since the holes that are swept into material 210 form both the pnp collector current and the npn base current, a reduced pnp collector current means a reduced npn base current. Reducing the npn base current, in turn, reduces the number of electrons that are injected into material 210 from n+ (npn emitter) region 228. Thus, when the number of holes flowing into material 210 decreases, the number of electrons injected into material 210 from n+ region 228 also decreases to maintain space charge neutrality.

Reducing the number of holes that are injected by p+ (pnp emitter) region 218 and the number of electrons that are injected by n+ (npn emitter) region 228 increases the holding voltage of triac 200. Thus, by properly setting the magnitude of the voltage dropped across voltage drop circuit 242, the magnitude of the holding voltage of triac 200 can be increased above a dc bias that is present on the to-be-protected node. As a result, triac 200 turns off following an ESD event on node 222.

When a voltage spike occurs on the second to-be-protected node rather than the first to-be-protected node, triac 200 operates the same, only in reverse. Thus, when a voltage across nodes 228 and 222 is positive and less than a trigger voltage, the voltage reverse biases the junction between n+ region 228/n-well 214 and p-type material 210, and forward-biases the junction between n+ region 220/n-well 212 and p-type material 210. The reverse-biased junction, in turn, blocks current from flowing from node 228 to node 222.

On the other hand, when the voltage across nodes 228 and 222 is equal to or greater than the trigger voltage, the reverse-biased junction breaks down due to avalanche multiplication. The breakdown of the junction due to avalanche multiplication causes a large number of holes to be injected into p-type material 210, and a large number of electrons to be injected into n-well 214.

The injected holes turn on a npn transistor that utilizes n+ region 220 as an emitter, p-type material 210 as a base, and n-well 214 as a collector. When the npn transistor turns on, n+ (emitter) region 220 injects electrons into (base) material 210. Most of the injected electrons diffuse through (base) material 210 and are swept from (base) material 210 into (collector) n-well 214 by the electric field that extends across the reverse-biased junction. The electrons in (collector) n-well 214 are then collected by n+ region 224.

A small number of the electrons injected into (base) material 210 recombine with holes in (base) material 210 and are lost. The holes lost to recombination with the injected electrons are replaced by holes injected into (base) material 210 by the broken-down reverse-biased junction and the collector current of a pnp transistor.

The electrons that are injected and swept into n-well 214 also decrease the potential of n-well 214 in the region that lies adjacent to p+ region 226, and eventually forward bias the junction between p+ region 226 and n-well 214. When the decreased potential forward biases the junction between p+ region 226 and n-well 214, a pnp transistor that utilizes p+ region 226 as an emitter, n-well 214 as a base, and p-type material 210 as a collector turns on.

When turned on, p+ (emitter) region 226 injects holes into (base) n-well 214. Most of the injected holes diffuse through (base) n-well 214 and are swept from (base) n-well 214 into (collector) p-type material 210 by the electric field that extends across the reverse-biased junction. The holes in (collector) material 210 flow into the forward-biased junction between material 210 and n-well 212, and are then collected by p+ region 218.

A small number of the holes injected into (base) n-well 214 recombine with electrons in (base) n-well 214 and are lost. The electrons lost to recombination with the injected holes are replaced by electrons flowing into n-well 214 as a result of the broken-down reverse-biased junction, and n-well 214 being the collector of the npn transistor. Thus, a small part of the npn collector current forms the base current of the pnp transistor.

Similarly, the holes swept into (collector) material 210 also provide the base current holes necessary to compensate for the holes lost to recombination with the diffusing electrons injected by n+ (emitter) region 220. As a result, a small part of the pnp collector current forms the base current of the npn transistor.

Thus, n+ region 220 injects electrons that provide both the electrons for the collector current of the npn transistor as well as the electrons for the base current of the pnp transistor. At the same time, p+ region 226 injects holes that provide both the holes for the collector current of the pnp transistor as well as the holes for the base current of the npn transistor.

In accordance with the present invention, the voltage dropped across voltage drop circuit 244 causes the voltage on p+ region 226 to be less than the voltage on n+ region 224. Thus, as an ESD event passes and the voltage on node 230 falls, the lower falling voltage on p+ region 226 reduces the forward bias across the junction between p+ region 226 and n-well 214, and eventually substantially reduces the number of holes injected into n-well 214.

Reducing the number of holes injected into n-well 214 reduces the number of holes that are swept into material 210. Since the holes that are swept into material 210 form both the pnp collector current and the npn base current, a reduced pnp collector current means a reduced npn base current. Reducing the npn base current, in turn, reduces the number of electrons that are injected into material 210 from n+ (npn emitter) region 220. Thus, when the number of holes flowing into material 210 decreases, the number of electrons injected into material 210 from n+ region 220 also decreases to maintain space charge neutrality.

Reducing the number of holes that are injected by p+ (pnp emitter) region 226 and the number of electrons that are injected by n+ (npn emitter) region 220 increases the holding voltage of triac 200. Thus, by properly setting the magnitude of the voltage dropped across voltage drop circuit 244, the magnitude of the holding voltage of triac 200 can be increased above a dc bias that is present on the to-be-protected node. As a result, triac 200 turns off following an ESD event on node 230.

Figure 3:
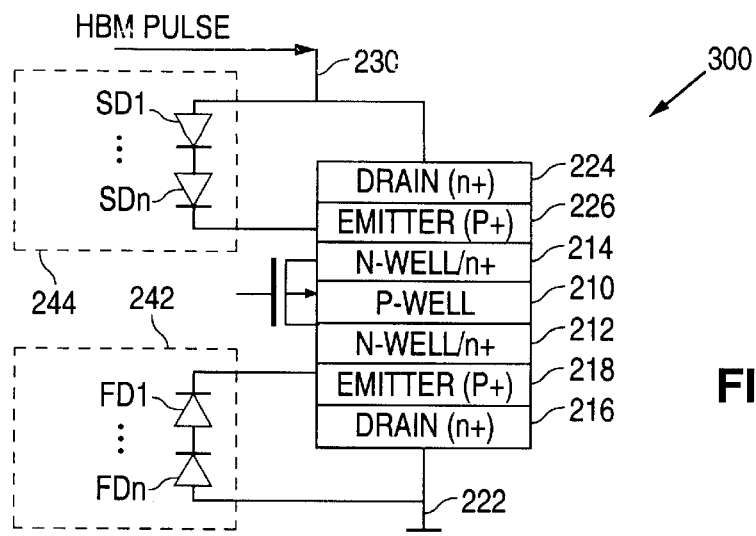
FIG. 3 is a block diagram illustrates a triac 300 in accordance with the present invention.

FIG. 3 shows a block diagram that illustrates a triac 300 in accordance with the present invention. As shown in FIG. 3, triac 300 is the same as triac 200 except that voltage drop circuit 242 is implemented in triac 300 with a number of diodes FD1–FDn connected in series. The anode of diode FDn is connected to first node 222, while the cathode of diode FD1 is connected to p+ region 218.

Similarly, voltage drop circuit 244 is implemented in triac 300 with a number of diodes SD1–SDn connected in series. The anode of the first diode SD1 is connected to second node 230, while the cathode of diode SDn is connected to p+ region 226. Triac 300 operates the same as triac 200, and the holding voltage is varied by varying the number of diodes FD1–FDn and SD1–SDn that are utilized.

Figure 4:
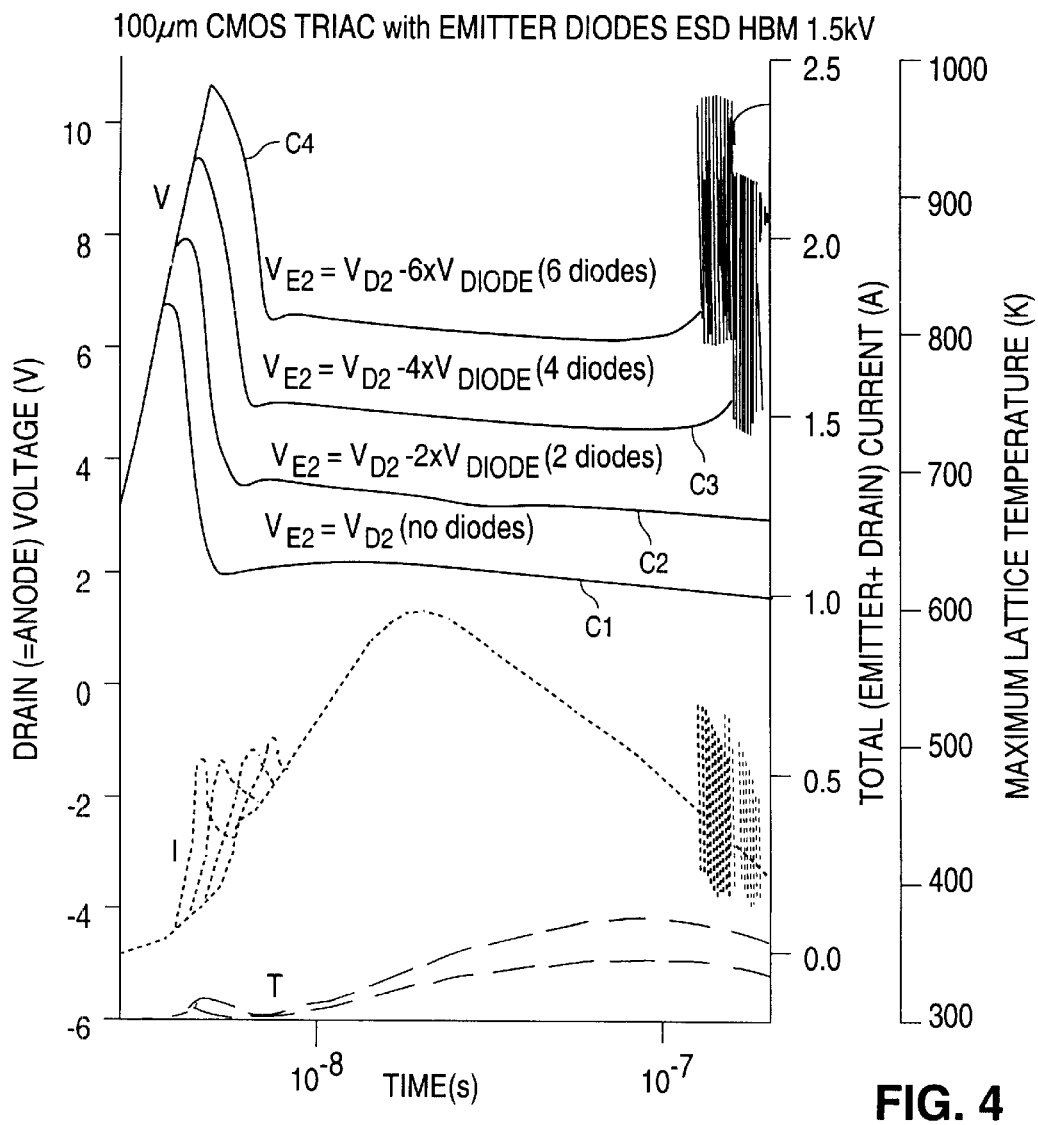
FIG. 4 is a graphical representation illustrating the characteristics of four triacs in accordance with the present invention.

FIG. 4 shows a graphical representation that illustrates the characteristics of four triacs in accordance with the present invention. In a first case C1 a triac is utilized with no voltage drop (conventional), while in a second case C2 a triac is utilized with two diode voltage drops (triac 300 with diodes dF1–DF2 and DS1–DS2).

In a third case C3 a triac is utilized with four diode voltage drops (triac 300 with diodes DF1–DF4 and DS1–DS4), while in a fourth case C4 a triac is utilized with six diode voltage drops (triac 300 with diodes DF1–DF6 and DS1–DS6). (The diodes provide a voltage drop of approximately 0.8 volts each. The four cases have been evaluated for a human-body model (HBM) ESD pulse using a thermally-coupled mixedmode device simulation.) As shown in FIG. 4, increasing the voltage drop increases the holding voltage of the triac after snapback.

Figure 5:
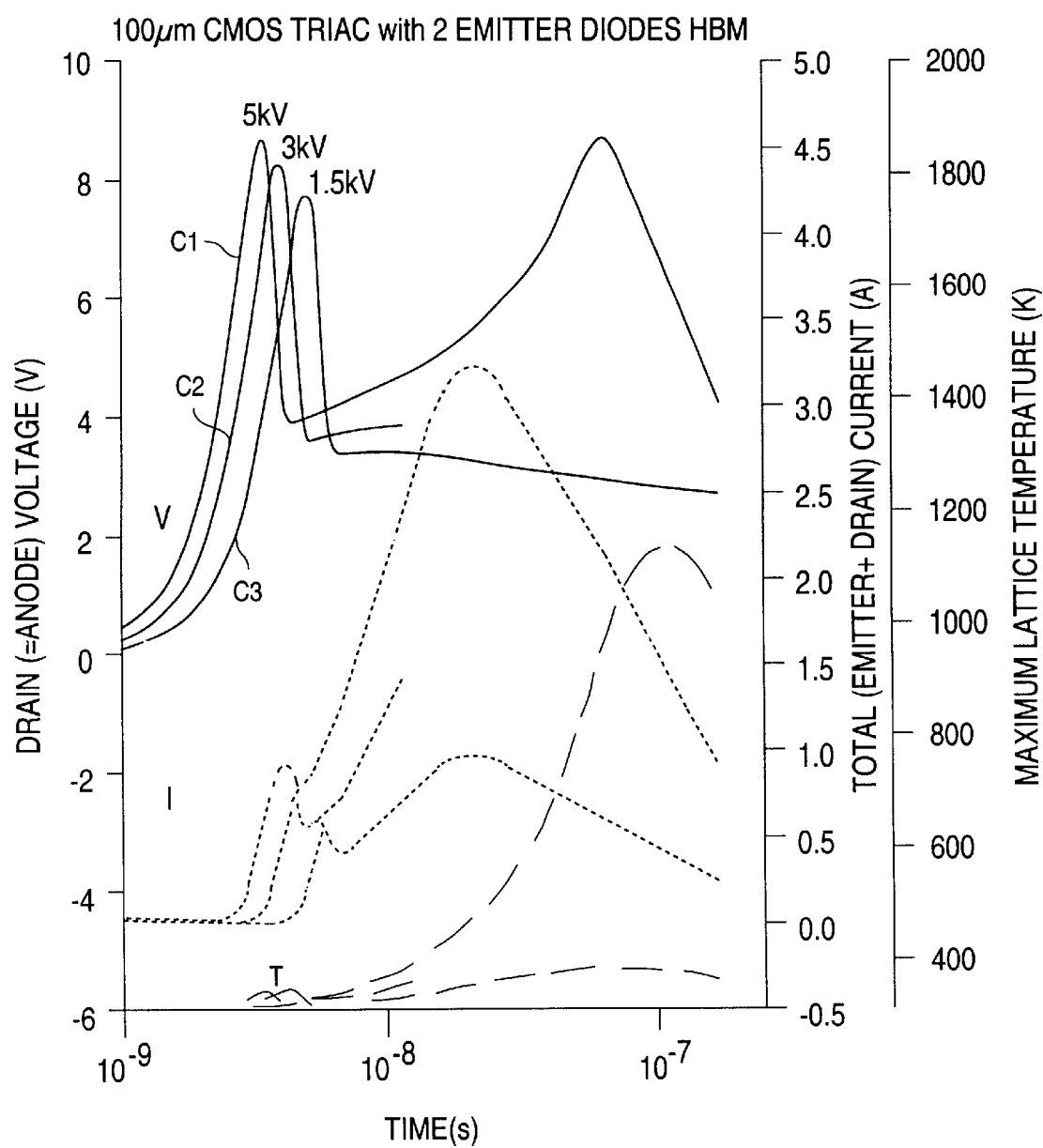
FIG. 5 is a graphical representation illustrating the minimum voltage limitations of a two-diode triac when three voltage spikes are applied in accordance with the present invention.

FIG. 5 shows a graphical representation that illustrates supporting the minimum voltage limitations for a two-diode triac when three voltage spikes are applied in accordance with the present invention. In a first case C1 a 5 kV HBM pulse is applied to a node, while in a second case C2 a 3 kV HBM pulse is applied to the node. In a third case C3 a 1.5 kV HBM pulse is applied to the node. (The three cases have been evaluated for a human-body model (HBM) ESD pulse using a thermally-coupled mixed-mode device simulation.)

As shown in FIG. 5, the triac of the present invention operates properly even at the point of critical ESD pulse overload, near the physical limitation of the protection circuit, where Joule overheating results in a voltage increase due to the mobility decrease and current saturation.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A triac formed in a semiconductor material of a first conductivity type, the semiconductor material having a dopant concentration, the triac comprising:

a first well of a second conductivity type formed in the semiconductor material, the first well having a dopant concentration;

a second well of the second conductivity type formed in the semiconductor material, the second well having a dopant concentration and being spaced apart from the first well;

a first region of the second conductivity type formed in the first well, the first region having a dopant concentration greater than the dopant concentration of the first well, the first region being connected to a first node;

a second region of the first conductivity type formed in the first well, the second region having a dopant concentration greater than the dopant concentration of the semiconductor material;

a third region of the second conductivity type formed in the semiconductor material and the first well, the third region having a dopant concentration greater than the dopant concentration of the first well;

a fourth region of the first conductivity type formed in the second well, the fourth region having a dopant concentration greater than the dopant concentration of the semiconductor material;

a fifth region of the second conductivity type formed in the second well, the fifth region having a dopant concentration greater than the dopant concentration of the second well, the fifth region being connected to a second node;

a first trace connected to the first node;

a second trace connected to the second region; and a first voltage drop circuit connected to the first trace and the second trace, the first voltage drop circuit having an electrical element being different than the first and second traces.

2. The triac of claim 1 and further comprising a sixth region of the second conductivity type formed in the semiconductor material and the second well, the sixth region having a dopant concentration greater than the dopant concentration of the second well.

3. The triac of claim 2 and further comprising a second voltage drop circuit connected between the fourth region and the second node.

4. A triac formed in a semiconductor material of a first conductivity type, the semiconductor material having a dopant concentration, the triac comprising:

a first well of a second conductivity type formed in the semiconductor material, the first well having a dopant concentration;

a second well of the second conductivity type formed in the semiconductor material, the second well having a dopant concentration and being spaced apart from the first well;

a first region of the second conductivity type formed in the first well, the first region having a dopant concentration greater than the dopant concentration of the first well, the first region being connected to a first node;

a second region of the first conductivity type formed in the first well, the second region having a dopant concentration greater than the dopant concentration of the semiconductor material;

a third region of the second conductivity type formed in the semiconductor material and the first well, the third region having a dopant concentration greater than the dopant concentration of the first well;

a fourth region of the first conductivity type formed in the second well, the fourth region having a dopant concentration greater than the dopant concentration of the semiconductor material;

a fifth region of the second conductivity type formed in the second well, the fifth region having a dopant concentration greater than the dopant concentration of the second well, the fifth region being connected to a second node;

a sixth region of the second conductivity type formed in the semiconductor material and the second well, the sixth region having a dopant concentration greater than the dopant concentration of the second well; and a first voltage drop circuit connected between the second region and the first node, the first voltage drop circuit including a number of diodes connected between the second region and the first node.

5. The triac of claim 4 wherein the number of diodes are connected in series between the second region and the first node.

6. The triac of claim 4 and further comprising:

a channel region defined in the semiconductor material between the third region and the sixth region; and a gate formed over the channel region.

7. A triac formed in a semiconductor material of a first conductivity type, the semiconductor material having a dopant concentration, the triac comprising:

a first well of a second conductivity type formed in the semiconductor material, the first well having a dopant concentration;

a second well of the second conductivity type formed in the semiconductor material, the second well having a dopant concentration and being spaced apart from the first well;

a first region of the second conductivity type formed in the first well, the first region having a dopant concentration greater than the dopant concentration of the first well, the first region being connected to a first node;

a second region of the first conductivity type formed in the first well, the second region having a dopant concentration greater than the dopant concentration of the semiconductor material;

a third region of the second conductivity type formed in the semiconductor material and the first well, the third region having a dopant concentration greater than the dopant concentration of the first well;

a fourth region of the first conductivity type formed in the second well, the fourth region having a dopant concentration greater than the dopant concentration of the semiconductor material;

a fifth region of the second conductivity type formed in the second well, the fifth region having a dopant concentration greater than the dopant concentration of the second well, the fifth region being connected to a second node;

a sixth region of the second conductivity type formed in the semiconductor material and the second well, the sixth region having a dopant concentration greater than the dopant concentration of the second well;

a first voltage drop circuit connected between the second region and the first node, the first voltage drop circuit including a first number of diodes connected between the second region and the first node; and a second voltage drop circuit connected between the fourth region and the second node, the second voltage drop circuit including a second number of diodes connected between the fourth region and the second node.

8. The triac of claim 7 wherein the first number of diodes are connected in series between the second region and the first node, and the second number of diodes are connected in series between the fourth region and the second node.

9. The triac of claim 7 and further comprising:
a channel region defined in the semiconductor material between the third region and the sixth region; and
a gate formed over the channel region.

10. A method of operating a triac formed in a semiconductor material of a first conductivity type, the semiconductor material having a dopant concentration, the triac comprising:
a first well of a second conductivity type formed in the semiconductor material, the first well having a dopant concentration;
a second well of the second conductivity type formed in the semiconductor material, the second well having a dopant concentration;
a first region of the second conductivity type formed in the first well, the first region having a dopant concentration greater than the dopant concentration of the first well, the first region being connected to a first node;
a second region of the first conductivity type formed in the first well, the second region having a dopant concentration greater than the dopant concentration of the semiconductor material;
a third region of the second conductivity type formed in the semiconductor material and the first well, the third region having a dopant concentration greater than the dopant concentration of the first well;
a fourth region of the first conductivity type formed in the second well, the fourth region having a dopant concentration greater than the dopant concentration of the semiconductor material;
a fifth region of the second conductivity type formed in the second well, the fifth region having a dopant concentration greater than the dopant concentration of the second well, the fifth region being connected to a second node;
a first trace connected to the first node;
a second trace connected to the second region; and
a first voltage drop circuit connected to the first trace and the second trace, the first voltage drop circuit having an electrical element being different than the first and second traces, the method comprising the steps of:
placing a first voltage on the first region;
placing a second voltage on the second region, the first and second voltages being different; and
placing a third voltage on the fifth region, the third voltage being different from the first and second voltages.

11. The method of claim 10 and further comprising a sixth region formed in the semiconductor material and the second well.

12. The method of claim 11 wherein the second voltage is less than the first voltage.

13. The method of claim 12 wherein the triac further includes a second voltage drop circuit connected between the fourth region and the second node.

14. The method of claim 13 wherein the first voltage drop circuit includes a first number of diodes connected between the second region and the first node, and the second voltage drop circuit includes a second number of diodes connected between the fourth region and the second node.

15. The triac of claim 14 wherein the first number of diodes are connected in series between the second region and the first node, and the second number of diodes are connected in series between the fourth region and the second node.

16. The method of claim 14 and further comprising:
a channel region defined in the semiconductor material between the third region and the sixth region; and
a gate formed over the channel region.

17. The method of claim 11 and further comprising:
a channel region defined in the semiconductor material between the third region and the sixth region; and
a gate formed over the channel region.

18. A method of operating a triac formed in a semiconductor material of a first conductivity type, the semiconductor material having a dopant concentration, the triac comprising:
a first well of a second conductivity type formed in the semiconductor material, the first well having a dopant concentration;
a second well of the second conductivity type formed in the semiconductor material, the second well having a dopant concentration;
a first region of the second conductivity type formed in the first well, the first region having a dopant concentration greater than the dopant concentration of the first well, the first region being connected to a first node;
a second region of the first conductivity type formed in the first well, the second region having a dopant concentration greater than the dopant concentration of the semiconductor material;
a third region of the second conductivity type formed in the semiconductor material and the first well, the third region having a dopant concentration greater than the dopant concentration of the first well;
a fourth region of the first conductivity type formed in the second well, the fourth region having a dopant concentration greater than the dopant concentration of the semiconductor material;
a fifth region of the second conductivity type formed in the second well, the fifth region having a dopant concentration greater than the dopant concentration of the second well, the fifth region being connected to a second node;
a sixth region formed in the semiconductor material and the second well; and
a first voltage drop circuit connected between the second region and the first node, the first voltage drop circuit including a number of diodes connected between the second region and the first node, the method comprising the steps of:
placing a first voltage on the first region;
placing a second voltage on the second region, the first and second voltages being different; and
placing a third voltage on the fifth region, the third voltage being different from the first and second voltages.

* * * * *